United States Patent
Xian et al.

(10) Patent No.: US 11,347,095 B2
(45) Date of Patent: May 31, 2022

(54) ARRAY SUBSTRATE AND DISPLAY APPARATUS

(71) Applicants: BEIJING BOE TECHNOLOGY DEVELOPMENT CO., LTD., Beijing (CN); BOE TECHNOLOGY GROUP CO., LTD., Beijing (CN)

(72) Inventors: Jianbo Xian, Beijing (CN); Hongfei Cheng, Beijing (CN); Yongda Ma, Beijing (CN); Yong Qiao, Beijing (CN); Xinyin Wu, Beijing (CN)

(73) Assignees: BEIJING BOE TECHNOLOGY DEVELOPMENT CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/769,929

(22) PCT Filed: Dec. 9, 2019

(86) PCT No.: PCT/CN2019/123985
§ 371 (c)(1),
(2) Date: Jun. 4, 2020

(87) PCT Pub. No.: WO2020/151382
PCT Pub. Date: Jul. 30, 2020

(65) Prior Publication Data
US 2021/0223605 A1 Jul. 22, 2021

(30) Foreign Application Priority Data
Jan. 21, 2019 (CN) .......................... 201920094767.3

(51) Int. Cl.
*G02F 1/1333* (2006.01)
*G02F 1/1343* (2006.01)
(Continued)

(52) U.S. Cl.
CPC .. *G02F 1/133388* (2021.01); *G02F 1/134318* (2021.01); *G02F 1/134363* (2013.01);
(Continued)

(58) Field of Classification Search
None
See application file for complete search history.

(56) References Cited

U.S. PATENT DOCUMENTS 10,146,092 B2  12/2018 Hui
10,411,189 B2   9/2019 Kong et al.
(Continued)

FOREIGN PATENT DOCUMENTS

CN   102169260 A   8/2011
CN   103545345 A   1/2014
(Continued)

OTHER PUBLICATIONS

English translation of JP-2003295226-A, Title: Liquid Crystal Display Device; Author: Kumakawa Katsuhiko; Nakao Kenji; Date of publication: Oct. 15, 2003 (Year: 2003).*
(Continued)

*Primary Examiner* — Shan Liu
(74) *Attorney, Agent, or Firm* — WHDA, LLP

(57) ABSTRACT

The present disclosure relates to an array substrate. The array substrate may include a display region comprising a plurality of first pixel regions and a dummy region adjacent to the display region. The dummy region may include a plurality of second pixel regions. At least one of the plurality of first pixel regions may include a first electrode region containing a first electrode and a first open region, at least one of the plurality of second pixel regions may include a second electrode region containing a second electrode and a second open region, and an area of the second open region may be larger than an area of the first open region.

19 Claims, 7 Drawing Sheets

(51) Int. Cl.
*G02F 1/1362* (2006.01)
*G02F 1/1368* (2006.01)

(52) U.S. Cl.
CPC ...... *G02F 1/1368* (2013.01); *G02F 1/136227* (2013.01); *G02F 1/136286* (2013.01)

(56) References Cited

U.S. PATENT DOCUMENTS

| | | | |
|---|---|---|---|
| 2011/0079785 A1* | 4/2011 | Song | G02F 1/134363 |
| | | | 257/59 |
| 2014/0125932 A1* | 5/2014 | Kawakami | G02F 1/133553 |
| | | | 349/110 |
| 2016/0103376 A1* | 4/2016 | Nagasawa | H01L 27/124 |
| | | | 257/72 |
| 2017/0205668 A1* | 7/2017 | Kim | G02F 1/13439 |
| 2018/0188616 A1* | 7/2018 | Jeong | G09G 3/3648 |

FOREIGN PATENT DOCUMENTS

| | | | | |
|---|---|---|---|---|
| CN | 107491209 A | | 12/2017 | |
| CN | 107831954 A | | 3/2018 | |
| CN | 209119103 U | | 7/2019 | |
| JP | 2003295226 A | * | 10/2003 | |
| WO | WO-2019098151 A1 | * | 5/2019 | ........... G02F 1/1335 |

OTHER PUBLICATIONS

English translation of WO-2019098151-A1, Title: Reflective Liquid Crystal Display Device; Author: Iwasa Takayuki; Date of publication: May 23, 2019 (Year: 2019).*

International Search Report dated Mar. 10, 2020, issued in counterpart Application No. PCT/CN2019/123985 (10 pages).

* cited by examiner

ARRAY SUBSTRATE AND DISPLAY APPARATUS

CROSS-REFERENCE TO RELATED APPLICATIONS

This application claims benefit of the filing date of Chinese Patent Application No. 201920094767.3 filed on Jan. 21, 2019, the disclosure of which is hereby incorporated in its entirety by reference.

TECHNICAL FIELD

The present disclosure relates to the technical field of display technology, in particular, to an array substrate and a display apparatus.

BACKGROUND

In the display apparatus, it is prone to have poor display quality at periphery of a display region, which may be caused by multiple reasons such as process residues generated during the manufacturing process.

BRIEF SUMMARY

One embodiment of the present disclosure provides an array substrate. The array substrate may include a display region comprising a plurality of first pixel regions and a dummy region adjacent to the display region. The dummy region may include a plurality of second pixel regions. At least one of the plurality of first pixel regions may include a first electrode region containing a first electrode and a first open region, at least one of the plurality of second pixel regions may include a second electrode region containing a second electrode and a second open region, and an area of the second open region may be larger than an area of the first open region.

Optionally, a difference between the area of the second open region and the area of the first open region may be 5% to 40% of the area of the first open region.

Optionally, an area ratio of the second open region to a corresponding second pixel region where the second open region is located may be larger than an area ratio of the first open region to a corresponding first pixel region where the first open region is located.

Optionally, the area ratio of the second open region to the corresponding second pixel region may be 1.5 to 9 times the area ratio of the first open region to the corresponding first pixel region.

Optionally, the plurality of first pixel regions may include a plurality of first electrode regions containing a plurality of first electrodes respectively. The plurality of first electrodes may be spaced apart and insulated from one another or the plurality of first electrodes may be divided into a plurality of groups, and the first electrodes of the same group may be connected to one another, and the first electrodes of different groups may be insulated from one another; or all of the plurality of first electrodes may be connected in a unitary structure.

Optionally, the second electrode may be connected to the first electrode in a unitary structure.

Optionally, an area of at least one of the first pixel regions may be about 1.5 times to 3 times an area of at least one of the second pixel regions.

Optionally, the plurality of first pixel regions may be arranged in a plurality of rows and columns in the display region. The plurality of second pixel regions may be arranged in a plurality of columns on at least one of two sides of the display region in a row direction and/or in a plurality of rows on at least one of two sides of the display region in a column direction.

Optionally, for any two of the plurality of columns of second pixel regions located on the same side of the display region, an area of a second open region in one of the two of the plurality of columns of second pixel regions farther away from the display region may be greater than or equal to an area of a second open region in the other one of the two of the plurality of columns of second pixel regions adjacent to the display region. For any two of the plurality of rows of second pixel regions located on the same side of the display region, an area of a second open region in one of the two of the plurality of rows of second pixel regions farther away from the display region may be greater than or equal to an area of a second open region in the other one of the two of the plurality of rows of second pixel regions adjacent to the display region.

Optionally, the array substrate may further include a first thin film transistor and a first pixel electrode in the at least one of the plurality of first pixel regions, a second thin film transistor in the at least one of the plurality of second pixel regions, and a passivation layer on one side of the first thin film transistor and the second thin film transistor opposite from the substrate. The first pixel electrode may be electrically connected to a drain electrode of the first thin film transistor.

Optionally, orthographic projection of the drain electrode of the first thin film transistor on the substrate and orthographic projection of the first open region on the substrate may have a first overlap region. Orthographic projection of a drain electrode of the second thin film transistor on the substrate and orthographic projection of the second open region on the substrate may have a second overlap region. An area of the second overlap region may be great than or equal to an area of the first overlap region.

Optionally, a first via hole may be disposed in the passivation layer in the at least one of the plurality of first pixel regions, and the first pixel electrode may be connected to the drain electrode of the first thin film transistor through the first via hole; and a second via hole may be disposed in the passivation layer in the at least one of the plurality of second pixel regions.

Optionally, orthographic projection of the first via hole on the substrate and orthographic projection of the first open region on the substrate may form a third overlap region, orthographic projection of the second via hole on the substrate and orthographic projection of the second open region on the substrate may form a fourth overlap region; and an area of the fourth overlap region may be larger than or equal to an area of the third overlap region.

Optionally, orthographic projection of the second open region on the substrate may surround orthographic projection of the second via hole on the substrate.

Optionally, the at least one of the plurality of second pixel regions may further include a second pixel electrode in the same layer as the first pixel electrode, and a drain electrode of the second thin film transistor may be insulated from the second pixel electrode.

Optionally, a plurality of first gate lines and a plurality of first data lines may be disposed in the display region, and the first gate lines and the first data lines may cross one another to define the plurality of first pixel regions. A plurality of second gate lines and a plurality of second data lines may be disposed in the dummy region, and the plurality of second gate lines and the plurality of second data lines may cross one another to define the plurality of second pixel regions. The second open region may overlap with at least a portion of the second gate lines.

Optionally, the first open region may include a plurality of first slits. Extending direction of the plurality of first data lines may be parallel to extending direction of the plurality of first slits. The second open region may include a plurality of second slits, and extending direction of the plurality of second data lines may be parallel to extending direction of the plurality of second slits.

Optionally, the extending direction of the first data lines may be the same as or intersects the extending direction of the second data lines.

Optionally, at least some of the second electrodes may be arranged exceeding the second data lines in a column direction.

One embodiment of the present disclosure is a display apparatus, which may include the array substrate according to one embodiment of the present disclosure.

BRIEF DESCRIPTION OF THE DRAWINGS

The drawings are intended to provide a further understanding of the disclosure, and are intended to be a part of the description of the disclosure. The drawings are used to explain the present disclosure with the following detailed description, but do not constitute a limitation of the disclosure. In the drawings.

DETAILED DESCRIPTION

Figure 1:
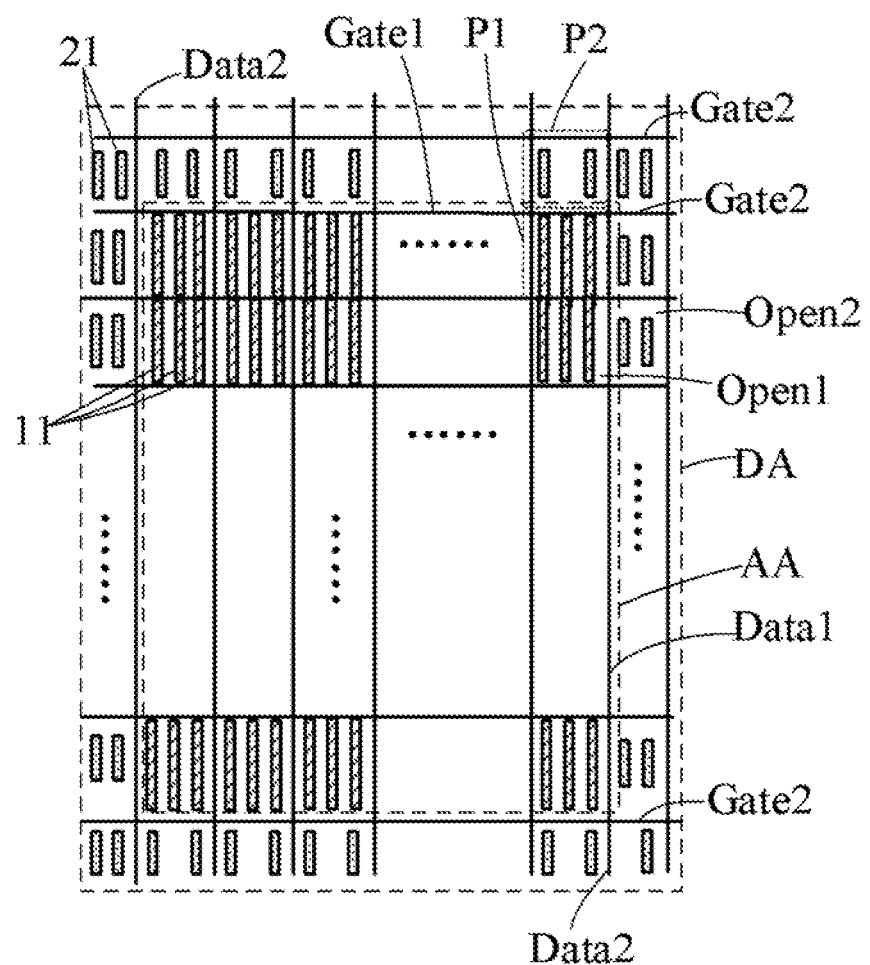
FIG. 1 is a schematic diagram of region division and electrode distribution on an array substrate provided in one embodiment of the present disclosure.

The specific embodiments of the present disclosure are further described in detail below with reference to the drawings and embodiments. The following examples are intended to illustrate the disclosure but are not intended to limit the scope of the disclosure. It should be noted that, in the case of no conflict, the features in the embodiments and the embodiments in the present application could be arbitrarily combined with each other. Throughout the description of the disclosure, reference is made to FIGS. 1-7. When referring to the figures, like structures and elements shown throughout are indicated with like reference numerals. It should be understood that the dimensions of the various parts shown in the drawings are not drawn in the actual scale.

One embodiment of the present disclosure provides an array substrate. FIG. 1 is a schematic diagram of region division and electrode distribution on an array substrate provided in one embodiment of the present disclosure. Other structures such as thin film transistors are omitted in FIG. 1. As shown in FIG. 1, the array substrate includes a display region AA and a dummy region DA adjacent to the display region AA. The display region AA includes a plurality of first pixel regions P1, and the dummy region DA includes a plurality of second pixel regions P2. The first electrode 1 is disposed in the first pixel regions P1, and the second electrode 21 is disposed in the second pixel region P2. Wherein, the first electrode 11 does not completely cover the first pixel region P1, and the second electrode 21 does not completely cover the second pixel region P2. Specifically, the first pixel region P1 includes: a first electrode region provided with the first electrode 11, that is, a region covered by the first electrode 11 in the first pixel region P1, and a first open region Open1 located outside the first electrode region, that is, a region uncovered by the first electrode 11 in the first pixel region P1. The second pixel region P2 includes: a second electrode region provided with the second electrode 21, that is, an region covered by the second electrode 21 in the second pixel region P2, and a second open region Open2 located outside the second electrode region, that is, a region uncovered by the second electrode 21 in the second pixel region P2. Furthermore, the second open region Open 2 in at least some of the second pixel regions P2 has a larger area than the first open region Open1 in any of the first pixel regions P1.

In one embodiment, the first electrode 11 and the second electrode 21 are both electrodes having a hollow region, and the hollow region on at least some of the second electrodes 21 has a larger area than the hollow region on any of the first electrodes 11.

It should be noted that the first electrodes 11 and the second electrodes 21 are disposed in the same layer. That is, the two electrodes are formed by the same layer of material through a patterning process, so the two electrodes are in the same layer in the laminating relationship. However, this does not mean that the distances between each of the two electrodes and the substrate of the array substrate must be the same.

Optionally, the area of the first open region Open is in a range of about 145 $\mu m^2$ to about 620 $\mu m^2$, and the area of the second open region Open 2 is in a range of about 155 $\mu m^2$ to about 868 $\mu m^2$.

Optionally, the second open region Open2 may be a part of the second pixel region P2 or the entire second pixel region P2. That is, the second pixel region P2 may not be provided with the second electrode 21.

Optionally, the difference between the area of the second open region Open 2 in at least some of the second pixel regions P2 and the area of the first open region Open1 is greater than 5% to 40% of the first open region Open1. In one embodiment, the area of the first open region Open1 is about 145 $\mu m^2$, the area of the second open region Open 2 is in a range of about 155 $\mu m^2$ to about 203 $\mu m^2$. In another embodiment, the area of the first open region Open 1 is about 620 $\mu m^2$, and the area of the second open region Open 2 is in a range of about 651 $\mu m^2$ to about 868 $\mu m^2$.

Optionally, an area ratio of the second open region Open 2 in at least some of the second pixel regions P2 to the corresponding second pixel region P2 where the second open region open 2 is located is greater than an area ratio of the first open region Open 1 to the corresponding first pixel region P1 where the first open region Open 1 is located.

Optionally, the area ratio of the second open region Open2 and its corresponding second pixel region P2 is 1.5 to 9 times the area ratio of the first open region Open1 and its corresponding first pixel region P1.

For example, the area ratio of the first open region Open1 and its first pixel region P1 is in a range of about 10% to about 60%, and the area ratio of the second open region Open2 and its corresponding second pixel region P2 is in a range of about 15% to about 90%.

Optionally, the second open regions Open2 in at least some of second pixel regions P2 has a width greater than a width of the first open region Open.

Optionally, the second open regions Open2 in at least some of second pixel regions P2 have a width that is 1.1 to 5 times a width of the first open region Open.

In the process of fabricating the array substrate, for example, in the process of fabricating the electrodes including the first electrodes and/or the second electrodes or the structures behind the electrodes, if the process residue such as etching solution or residue etched by the etching solution may remain in the display region AA, it is easy to cause a low yield of the corresponding structures in the display region AA. For example, a short circuit between the electrodes may occurs, thereby resulting in poor display effect. In one embodiment of the present disclosure, an area of the second open region Open2 in each of at least some of the second pixel regions P2 is larger than an area of the first open region Open1. For example, the hollow region on the second electrode 21 in the dummy region DA is larger than the hollow region on the first electrode 11 in the display region AA. Therefore, during the preparation of the first electrodes 11 and the second electrodes 21, the process residue is more likely to enter the hollow region on the second electrode 21 of the dummy region DA. Thereby, the influence of the process residue on the first electrode 11 and the subsequent structure in the display region AA is reduced or eliminated, thereby improving the display effect.

In addition, the area of the hollow region on the second electrode 21 is larger, thereby reducing the overlap capacitance formed by the second electrode 21 and other conductive structures. As a result, the influence of the overlap capacitance on the display effect of the display region AA is reduced.

Figure 2:
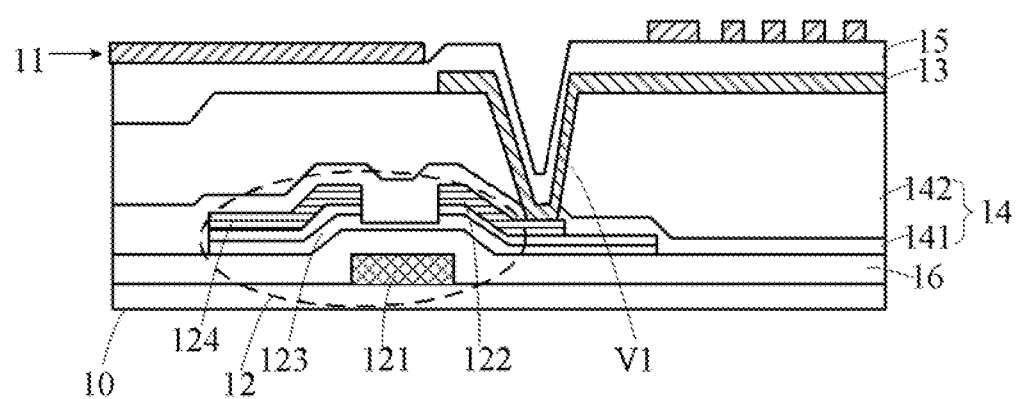
FIG. 2 is a cross-sectional view showing structure of a first pixel region P1 according to one embodiment of the present disclosure.
Figure 3:
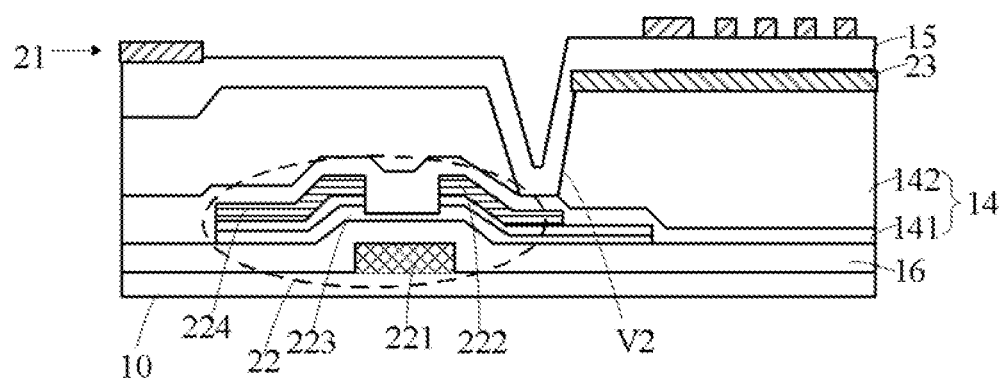
FIG. 3 is a cross-sectional view showing structure of a second pixel region P2 according to one embodiment of the present disclosure.

FIG. 2 is a cross-sectional view showing a structure of a first pixel region P1 according to one embodiment of the present disclosure, and FIG. 3 is a cross-sectional view showing a structure of a second pixel region P2 according to one embodiment of the present disclosure. As shown in FIG. 1 to FIG. 3, the display region AA is provided with a plurality of first gate lines Gate1 and a plurality of first data lines Data1. The first gate lines Gate1 and the first data lines Data1 are arranged to intersect one another to define a plurality of first pixel regions P1. The dummy region DA is provided with a plurality of intersecting second gate lines Gate2 and the second data lines Data2. The plurality of the intersecting second gate lines Gate2 and the second data lines Data2 define a plurality of second pixel regions P2.

Optionally, the plurality of first pixel regions P1 of the display region AA may be arranged in a plurality of rows and columns. The first gate lines Gate1 extend in the row direction, and the first data lines Data1 extend in the column direction. One side or both sides of the display region AA in the row direction (ie, the left side and/or the right side of the display region AA in FIG. 1) may be provided with the second pixel regions P2. At this time, a second gate line Gate2 and a first Gate line Gate1 can be different parts of the same signal line. One side or both sides of the display region AA in the column direction (ie, the upper side and/or the lower side of the display region AA in FIG. 1) may be provided with the second pixel regions P2. At this time, a first data line Data1 and a second data Line Data2 can be different parts of the same signal line.

The array substrate of the present disclosure can be used in an organic electroluminescence display (OLED) apparatus. For example, the first electrode 11 can be an anode of a light emitting unit. The array substrate can also be used in a liquid crystal display apparatus. As a specific application of the present disclosure, the array substrate is used in a liquid crystal display apparatus, and the first electrode 11 is a common electrode.

Optionally, as shown in FIG. 2, a first thin film transistor 12 and a first pixel electrode 13 are further provided in the first pixel region P1. The first thin film transistor 12 is disposed on the substrate 10. The first thin film transistor 12 includes a gate electrode 121, an active layer 123, a source electrode 124 and a drain electrode 122. A gate insulating layer 16 is disposed between the gate electrode 121 and the active layer 123 of the first thin film transistor 12. The gate insulating layer 16 covers the entire display region AA and the entire dummy region DA. A side of the first thin film transistor 12 opposite from the substrate 10 is provided with a passivation layer 14 covering the display region AA and the dummy region DA. The passivation layer 14 may be a single layer film or a composite layer film. The passivation layer may be made of an inorganic material or an organic material, or a mixture of an inorganic and organic material or the like. For example, in the structure shown in FIG. 2, the passivation layer 14 may specifically include a first passivation layer 141 and a second passivation layer 142 on a side of the first passivation layer 141 opposite from the substrate 10. In one embodiment, the passivation layer 141 includes an inorganic material, specifically $SiN_X$ or $SiO_X$, and the like, and the second passivation layer 142 includes an organic resin. The first pixel electrode 13 and the first electrode 11 are both disposed on a side of the passivation layer 14 opposite from the substrate 10. The first pixel electrode 13 is insulated from the first electrode 11. The drain electrode 122 of the first thin film transistor 12 is electrically connected to the first pixel electrode 13.

Optionally, a first via hole V1 corresponding to the drain electrode 122 of the first thin film transistor 12 is formed in the passivation layer 14. The first pixel electrode 13 is electrically connected to the drain electrode 122 of the first thin film transistor 12 through the first via hole V1.

Optionally, as shown in FIG. 3, a second thin film transistor 22 and a second pixel electrode 23 are provided in the second pixel region P2. The second thin film transistor 22 is disposed on the substrate 10, and the second electrode 21 is disposed on a side of the second thin film transistor 22 opposite from the substrate 10. The second thin film transistor includes a gate electrode 221, an active layer 223, a source electrode 224, and a drain electrode 222, and the gate electrode 221 and the active layer 223 of the second thin film transistor 22 are spaced apart by the gate insulating layer 16. A second via hole V2 corresponding to the drain electrode 222 of the second thin film transistor 22 is disposed in the passivation layer 14. The second pixel electrode 23 is insulated from the drain electrode of the second thin film transistor 22.

Optionally, the second via hole V2 may not be disposed; or the depth of the second via hole V2 is smaller than the depth of the first via hole V1.

Optionally, the corresponding structures in the first thin film transistor 12 and the second thin film transistor 22 are disposed in the same layer. For example, the gate electrode 121 of the first thin film transistor 12 and the gate electrode 221 of the second thin film transistor 22 are disposed in the same layer. In addition, the first pixel electrode 13 and the second pixel electrode 23 are disposed in the same layer.

Optionally, a pixel electrode insulating layer 15 is disposed between the first pixel electrode 13 and the first electrode 11. The pixel electrode insulating layer 15 covers the display region AA and the dummy region DA, and the first electrode 11 and the second electrode 21 are disposed at one side of the pixel electrode insulating layer 15 opposite from the substrate 10.

Optionally, a pixel electrode insulating layer 15 is disposed between the first pixel electrode 13 and the first electrode 11. The pixel electrode insulating layer 15 covers the display region AA and the dummy region DA, and the first pixel electrode 13 and the second pixel electrode 23 are disposed at one side of the pixel electrode insulating layer 15 facing the substrate 10.

Optionally, the different first electrodes 11 may be spaced apart from on another. Of course, the plurality of first electrodes 11 in the display region AA may also be divided into a plurality of groups. Each group includes a plurality of first electrodes 11. The first electrodes 11 in the same group are connected to one another, and the first electrodes 11 of different groups are insulated from one another. Alternatively, all of the first electrodes 11 may be connected in a unitary structure.

Figure 4:
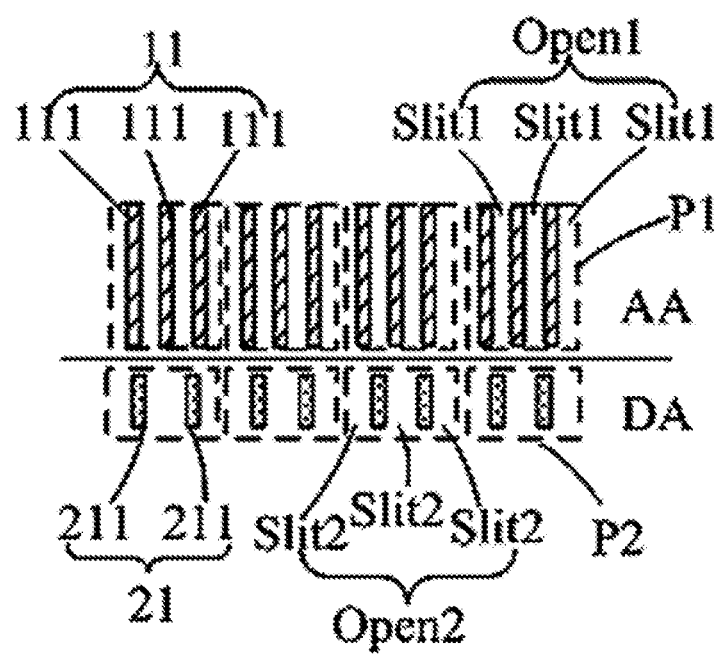
FIG. 4 is a schematic view showing distribution of first electrodes and second electrodes in a partial region according to one embodiment of the present disclosure.

In one embodiment, as shown in FIG. 4, the first electrode 11 may include a plurality of first electrode strips 111. At this time, the first open region Open1 includes a plurality of slits (Slit1). In one embodiment, the plurality of first electrode strips 111 may be spaced apart from each other, and the two ends of the adjacent first electrode strips 111 at both sides are connected to each other to form a closed structure. In one embodiment, the plurality of first electrode strips 111 may also be formed into a semi-closed structure. For example, the ends of the plurality of first electrode strips 111 at the same side are connected, so that the first electrode 11 forms a comb electrode.

As shown in FIG. 4, the second electrode 21 may include a plurality of second electrode strips 211. At this time, the second open region Open2 includes a plurality of slits (Slit2). In one embodiment, the plurality of second electrode strips 211 may be spaced apart from each other, and the two ends of the adjacent second electrode strips 211 at both sides are connected to each other to form a closed structure. In one embodiment, the plurality of second electrode strips 211 may also be formed into a semi-closed structure. For example, the ends of the plurality of second electrode strips 211 at the same side are connected, so that the second electrode 12 forms a comb electrode.

Optionally, the specific shapes of the first electrode 11, the slit (Slit1), the second electrode 12, and the slit (Slit2) are not limited. For example, they may have irregular shapes such as folded lines.

Optionally, at least some of the second open regions Open2 have a width greater than at least one slit (Slit1) of the first open region Open1.

Optionally, the width of the slit (Slit2) in at least some of the second open regions Open2 is greater than the width of the slit (Slit1) of the first open region Open1. Optionally, the width of the slit (Slit2) in at least some of the second open regions Open2 is 1.1 to 5 times the width of the slit (Slit1) of the first open region Open1.

Figure 5:
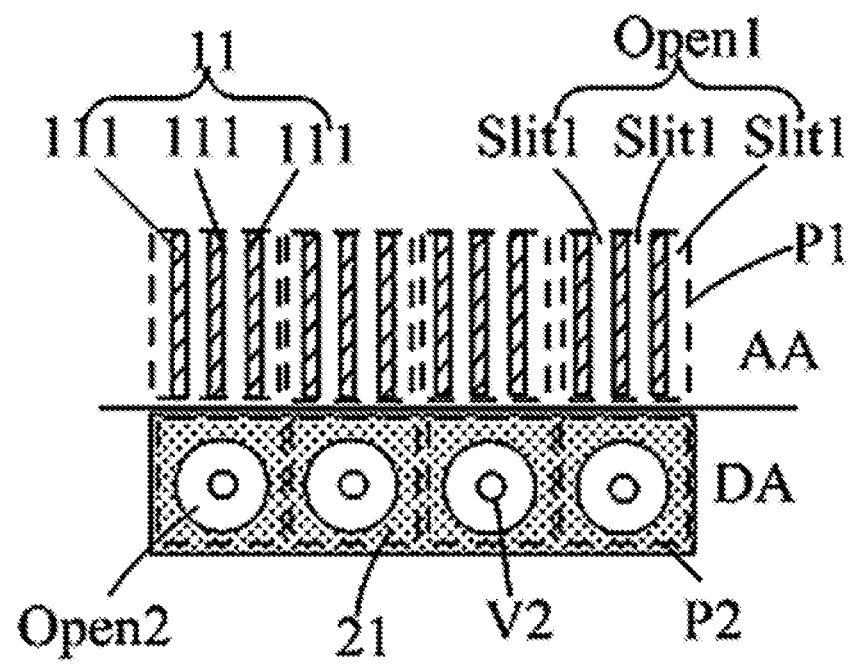
FIG. 5 is a schematic view showing the distribution of first electrodes and second electrodes in a partial region according to one embodiment of the present disclosure.
Figure 6:
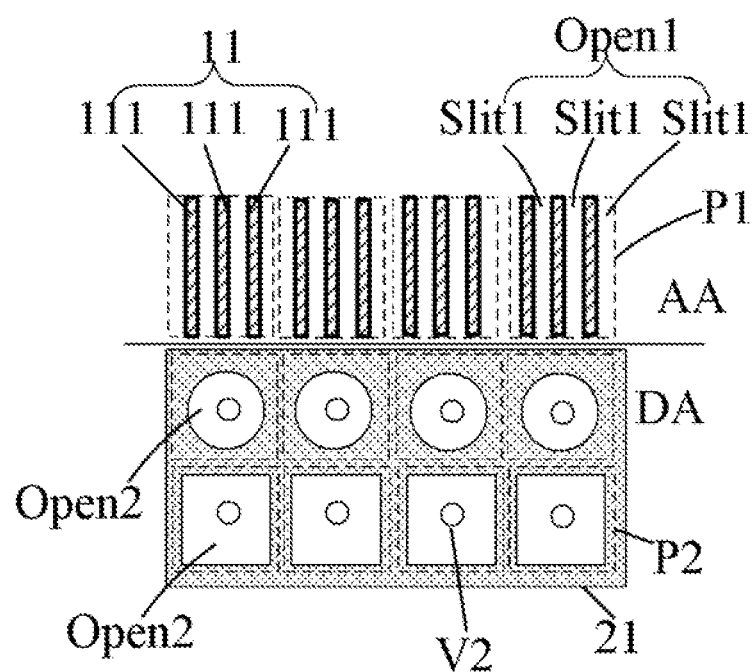
FIG. 6 is a schematic view showing the distribution of first electrodes and second electrodes in a partial region according to one embodiment of the present disclosure.

According to FIGS. 2, 3, 5 and 6, in some embodiments, the orthographic projection of the second open region Open2 on the substrate 10 surrounds the orthographic projection of the second via hole V2 on the substrate 10. That is, the boundary of the hollow region formed on the second electrode 21 is a ring shape surrounding the region where the second via hole V2 is located. As shown in FIGS. 5 and 6, the ring shape may be a circle or a rectangular ring. In the structures of FIGS. 5 and 6, the static electricity generated in the process at the second via hole V2 can be shielded by the second electrode 21, thereby reducing the influence of static electricity on the structure in the display region AA.

The second electrode 21 may be connected to the first electrode 11 as a unitary structure. Of course, it is also possible to insulate the different second electrodes 21 from each other. Alternatively, all the electrodes including the first electrodes 11 and the second electrodes 21 may be divided into a plurality of groups. Each group includes a plurality of first electrodes 11 and/or a plurality of second electrodes 21. The electrodes of the same group are connected to each other, and the electrodes of different groups are insulated from each other.

Figure 7:
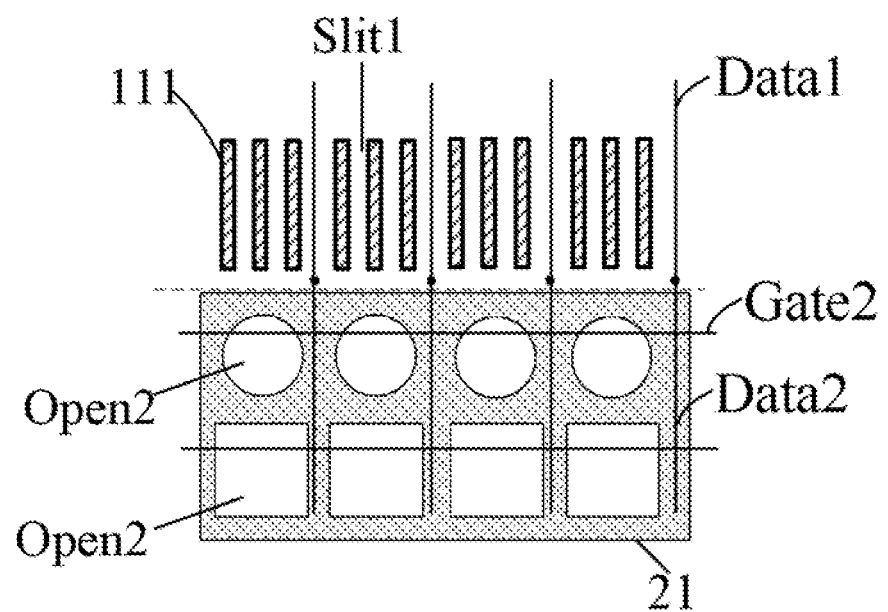
FIG. 7 is a schematic view showing the distribution of the first electrode and the second electrode in a partial region according to one embodiment of the present disclosure.

In the first pixel region P1, a horizontal electric field can be formed between the electrode strips 111 of the first electrode 11 and the first pixel electrode 13. As shown in FIG. 6 and FIG. 7, the first data line Data1 and the slit (Slit1) of the first open region Open1 are parallel, which can better adjust the horizontal electric field distribution and improve the display effect. When the second open region Open2 includes a plurality of slits (Slit2)(as shown in FIG. 4), the second data line Data2 is parallel to the slit (Slit2) of the second open region Open2. As such, the deflection state of the liquid crystal molecules at the boundary between the display region AA and the dummy region DA can be prevented from being significantly changed, thereby ensuring normal display at the boundary position of the display region AA, and that the electric field of the dummy region DA is prevented from adversely affecting the display of the display region AA.

Optionally, when the orthographic projection shape of the second open region Open2 on the substrate 10 is a polygon, as shown in FIG. 7, the second data line Data2 is parallel to at least one side of the polygon.

Optionally, in some embodiments of the present disclosure, the extending directions of the first data line Data1 and the second data line Data2 intersect or are in the same direction, and may be set according to requirements. For example, it may be designed according to the shape structure of the first open region Open1 of the display region AA and the second open region Open2 of the dummy region DA to reduce the process difficulty.

Generally, in the fabrication process of the array substrate, the etching liquid is likely to accumulate at the boundary of the process region (ie, the total region formed by the display region AA and the dummy region DA). In order to minimize the influence of the residual etching liquid on the display region AA, in some embodiments, at least one of the two sides of the display region AA in the row direction (ie, at least one of the left and right sides) is provided with a plurality of columns of second pixel region P2; and/or, at least one of the two sides of the display region AA along the column direction (ie, at least one of the upper and lower sides) is provided with a plurality of rows of second pixel regions P2, as shown in FIGS. 6 and 7. Thereby, the residual etching liquid flows to the dummy regions DA, and the influence of the residual etching liquid on the display effect of the display region AA is reduced.

Optionally, two rows of second pixel regions P2 may be disposed on each of the upper and lower sides of the display region AA, and two columns of second pixel regions P2 are disposed on each of the left and right sides of the display region AA.

Optionally, in any two second pixel regions P2 located on the same side of the display region AA, the area of the second open region Open2 in the second pixel region P2 near the display region AA is not larger than the area of the second open region Open2 in the second pixel region P2 farther away from the display region AA. That is, when at least one of the two sides of the display region AA in the row direction is provided with the plurality of columns of the second pixel regions P2, among any two columns of the plurality of columns of the second pixel regions P2, the area of the second open region Open2 in one column of the second pixel region P2 near the display region AA is not larger than the area of the second open region Open2 in one column of the second pixel regions P2 farther away from the display region AA. When at least one of the two sides of the display region AA along the column direction is provided with a plurality of rows of the second pixel regions P2, among any two rows of the plurality of rows of the second pixel regions P2, the area of the second open region Open2 of one row of the second pixel region P2 near the display region AA is not larger than the area of the second open region Open2 of one row of the second pixel region P2 farther away from the display region AA.

Optionally, on the same side of the display region AA, along the direction gradually away from the display region AA, the area of the second open region Open2 in the second pixel region P2 is gradually increased. Therefore, the residual etching liquid is kept away from the display region AA as much as possible, thereby minimizing the influence of the residual etching liquid on the display effect.

Wherein, the area of the first pixel region P1 may be 1.5 to 3 times of the area of the second pixel region P2, thereby reducing the area occupied by the dummy region DA and accordingly facilitating the display apparatus to implement a narrow border.

In some embodiments, the orthographic projection of the drain electrode of the first thin film transistor 12 on the substrate and the orthographic projection of the first open region Open1 on the substrate 10 have a first overlap region. The orthographic projection of the drain electrode of the second thin film transistor 22 on the substrate and the orthographic projection of the second open region Open2 on the substrate 10 have a second overlap region. Wherein, the area of the first overlap region is less than or equal to the area of the second overlap region.

Optionally, the area of the second overlap region is 1.1 to 1.5 times the area of the first overlap region.

Since the drain electrode of the thin film transistor has a certain height, the parts of the pixel electrode insulating layer 15 corresponding to the first overlap region and the second overlap region respectively form a step, and it is more likely to accumulate process residues in the step positions. Therefore, when the area of the second overlap region is larger than that of the first overlap region, it is more likely to accumulate more process residues in the second pixel region P2, thereby minimizing the effect of the process residue on the preparation of display region AA and accordingly reducing display defects.

In some embodiments, the orthographic projection of the first via hole V1 in the passivation layer 14 on the substrate 10 and the orthographic projection of the first open region on the substrate 10 form a third overlap region. The projection of the second via hole V2 in the passivation layer 14 on the substrate 10 and the orthographic projection of the second dummy region DA on the substrate 10 form a fourth overlap region. Wherein, the area of the third overlap region is smaller than the area of the fourth overlap region. Optionally, the area of the fourth overlap region is larger than the area of the third overlap region.

Optionally, as shown in FIG. 2 and FIG. 3, the pixel electrode insulating layer 15 forms a certain dent at positions corresponding to the first via hole V1 and the second via hole V2 respectively, and it is easy to collect process residues in the dents. Therefore, when the area of the fourth overlap region is larger than the area of the third overlap region, the process residue is more likely to be concentrated in the second pixel region P2, thereby minimizing the influence of the process residue on the preparation effect of the display region AA, and accordingly reducing display defects.

As shown in FIG. 7, in some embodiments, the second open region Open2 overlaps with at least a portion of the second gate line Gate2, thereby reducing the overlap capacitance between the second gate line Gate2 and the second electrode 21, thereby reducing the delay caused by the overlap capacitance of the two and accordingly improving the display effect of the display region AA.

Optionally, at least a portion of each column of the second electrodes 21 extends beyond the second data line Data2 in the column direction. That is, the lower end of each column of the second electrodes 21 exceeds the lower end of the second data line Data2 and/or the upper end of each column of the second electrode 21 exceeds the upper end of the second data line Data2. In this way, the length of the second data line Data2 can be reduced, thereby reducing the fabrication material of the second data line Data 2. At the same time, the overlap capacitance between the second data line Data2 and the second electrode 21 can be reduced, thereby, reducing the delay caused by the overlap capacitance to the signal transmission and accordingly improving the display effect of the display region AA.

The present disclosure also provides a display apparatus comprising the above array substrate according to one embodiment of the present disclosure. The display apparatus may be any product or component having a display function, such as an electronic paper, an OLED panel, a mobile phone, a tablet computer, a television, a display, a notebook computer, a digital photo frame, a navigator, and the like.

Since the above array substrate can concentrate the process residue in the dummy region as much as possible, thereby reducing the influence of the process residue on the preparation of the display region. Accordingly, the display apparatus including the above array substrate can achieve a better display effect.

The principles and the embodiments of the present disclosure are set forth in the specification. The description of the embodiments of the present disclosure is only used to help understand the apparatus and method of the present disclosure and the core idea thereof. Meanwhile, for a person of ordinary skill in the art, the disclosure relates to the scope of the disclosure, and the technical scheme is not limited to the specific combination of the technical features, but also covers other technical schemes which are formed by combining the technical features or the equivalent features of the technical features without departing from the inventive concept. For example, a technical scheme may be obtained by replacing the features described above as disclosed in this disclosure (but not limited to) with similar features.

What is claimed is:

1. An array substrate, comprising:
a display region, the display region comprising a plurality of first pixels; and
a dummy region adjacent to the display region, the dummy region comprising a plurality of second pixels;
wherein each of the plurality of first pixels comprises a first electrode region containing a plurality of first electrodes and a first open region, each of the plurality of second pixels comprises a second electrode region containing a plurality of second electrodes and a second open region, the plurality of first electrodes are spaced apart and insulated from one another, the plurality of second electrodes are spaced apart and insulated from one another, and a quantity of the plurality of first electrodes is greater than a quantity of the plurality of second electrodes;
a plurality of first gate lines and a plurality of first data lines are disposed in the display region, and the first gate lines and the first data lines cross one another to define the plurality of first pixels; a plurality of second gate lines and a plurality of second data lines are disposed in the dummy region, and the plurality of second gate lines and the plurality of second data lines cross one another to define the plurality of second pixels, each of the plurality of first pixels is defined only by one first gate line and one first date line, and each of the plurality of second pixels is defined only by one second gate line and one second data line; and
an area of the second open region is larger than an area of the first open region.

2. The array substrate according to claim 1, wherein an area of at least one of the first pixels is about 1.5 times to 3 times an area of at least one of the second pixels.

3. The array substrate according to claim 1, wherein the plurality of first pixels is arranged in a plurality of rows and columns in the display region; and wherein
the plurality of second pixels is arranged in a plurality of columns on at least one of two sides of the display region in a row direction and/or in a plurality of rows on at least one of two sides of the display region in a column direction.

4. The array substrate according to claim 3, wherein for any two of the plurality of columns of second pixels located on the same side of the display region, an area of a second open region in one of the two of the plurality of columns of second pixels farther away from the display region is greater than or equal to an area of a second open region in the other one of the two of the plurality of columns of second pixels adjacent to the display region; and
for any two of the plurality of rows of second pixels located on the same side of the display region, an area of a second open region in one of the two of the plurality of rows of second pixels farther away from the display region is greater than or equal to an area of a second open region in the other one of the two of the plurality of rows of second pixels adjacent to the display region.

5. The array substrate according to claim 1, further comprising:
a first thin film transistor and a first pixel electrode in the at least one of the plurality of first pixels,
a second thin film transistor in the at least one of the plurality of second pixels, and
a passivation layer on one side of the first thin film transistor and the second thin film transistor opposite from the substrate;
wherein the first pixel electrode is electrically connected to a drain electrode of the first thin film transistor.

6. The array substrate according to claim 5, wherein orthographic projection of the drain electrode of the first thin film transistor on the substrate and orthographic projection of the first open region on the substrate have a first overlap region,
orthographic projection of a drain electrode of the second thin film transistor on the substrate and orthographic projection of the second open region on the substrate have a second overlap region, and
an area of the second overlap region is great than or equal to an area of the first overlap region.

7. The array substrate according to claim 5, wherein a first via hole is disposed in the passivation layer in the at least one of the plurality of first pixels, and the first pixel electrode is connected to the drain electrode of the first thin film transistor through the first via hole; and
a second via hole is disposed in the passivation layer in the at least one of the plurality of second pixels.

8. The array substrate according to claim 7, wherein orthographic projection of the second open region on the substrate surrounds orthographic projection of the second via hole on the substrate.

9. The array substrate according to claim 5, wherein the at least one of the plurality of second pixels further comprises a second pixel electrode in the same layer as the first pixel electrode, and a drain electrode of the second thin film transistor is insulated from the second pixel electrode.

10. The array substrate according to claim 1, wherein
the second open region overlap with at least a portion of the second gate lines.

11. The array substrate according to claim 10, wherein the first open region comprises a plurality of first slits; extending direction of the plurality of first data lines is parallel to extending direction of the plurality of first slits; and
the second open region comprises a plurality of second slits, extending direction of the plurality of second data lines is parallel to extending direction of the plurality of second slits.

12. The array substrate according to claim 11, wherein the extending direction of the first data lines is the same as or intersects the extending direction of the second data lines.

13. The array substrate according to claim 10, wherein at least some of the second electrodes is arranged exceeding the second data lines in a column direction.

14. A display apparatus comprising the array substrate according to claim 1.

15. The array substrate according to claim 1, wherein a difference between the area of the second open region and the area of the first open region is 5% to 40% of the area of the first open region.

16. The array substrate according to claim 1, wherein an area ratio of the second open region to a corresponding second pixel where the second open region is located is larger than an area ratio of the first open region to a corresponding first pixel where the first open region is located.

17. The array substrate according to claim 16, wherein the area ratio of the second open region to the corresponding second pixel is 1.5 to 9 times the area ratio of the first open region to the corresponding first pixel.

18. The array substrate according to claim 1, wherein the plurality of first pixels comprises a plurality of first electrode regions containing a plurality of first electrodes respectively, and wherein the plurality of first electrodes are spaced apart and insulated from one another; or the plurality of first electrodes are divided into a plurality of groups, and the first electrodes of the same group are connected to one another, and the first electrodes of different groups are insulated from one another; or all of the plurality of first electrodes are connected in a unitary structure.

19. An array substrate, comprising:

a display region, the display region comprising a plurality of first pixel regions; and a dummy region adjacent to the display region, the dummy region comprising a plurality of second pixel regions;

a first thin film transistor and a first pixel electrode in the at least one of the plurality of first pixel regions, a second thin film transistor in the at least one of the plurality of second pixel regions, and a passivation layer on one side of the first thin film transistor and the second thin film transistor opposite from the substrate;

wherein the first pixel electrode is electrically connected to a drain electrode of the first thin film transistor;

wherein at least one of the plurality of first pixel regions comprises a first electrode region containing a first electrode and a first open region, at least one of the plurality of second pixel regions comprises a second electrode region containing a second electrode and a second open region, and an area of the second open region is larger than an area of the first open region;

wherein a first via hole is disposed in the passivation layer in the at least one of the plurality of first pixel regions, and the first pixel electrode is connected to the drain electrode of the first thin film transistor through the first via hole; and a second via hole is disposed in the passivation layer in the at least one of the plurality of second pixel regions;

wherein orthographic projection of the first via hole on the substrate and orthographic projection of the first open region on the substrate form a third overlap region, orthographic projection of the second via hole on the substrate and orthographic projection of the second open region on the substrate form a fourth overlap region; and an area of the fourth overlap region is larger than or equal to an area of the third overlap region.

* * * * *